(12) United States Patent
Rachedine et al.

(10) Patent No.: US 7,230,505 B2
(45) Date of Patent: Jun. 12, 2007

(54) VOLTAGE CONTROLLED OSCILLATOR WITH GAIN CONTROL

(75) Inventors: Mohammed Rachedine, Mundelein, IL (US); Daniel L. Kaczman, Gurnee, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 114 days.

(21) Appl. No.: 11/098,110

(22) Filed: Apr. 4, 2005

(65) Prior Publication Data

US 2006/0220758 A1 Oct. 5, 2006

(51) Int. Cl.
*H03B 5/00* (2006.01)
*H03L 7/099* (2006.01)

(52) U.S. Cl. ............... 331/179; 331/25; 331/177 R; 331/185

(58) Field of Classification Search .......... 331/8, 331/10, 11, 17, 18, 25, 117 R, 117 FE, 117 D, 331/177 R, 177 V, 179, 185–186
See application file for complete search history.

(56) References Cited

U.S. PATENT DOCUMENTS 4,942,374 A 7/1990 Sai
5,949,289 A * 9/1999 Smith et al. ............... 331/8
6,538,521 B2 3/2003 Kobayashi et al.
6,693,969 B1 2/2004 Montalvo et al.

FOREIGN PATENT DOCUMENTS

JP 2004072650 3/2004

* cited by examiner

*Primary Examiner*—David Mis
(74) *Attorney, Agent, or Firm*—Gary R. Stanford

(57) ABSTRACT

A VCO circuit including a VCO, a voltage supply and a control circuit. The VCO has a supply voltage input and a gain that changes with its supply voltage. The voltage supply has an adjust input and an output coupled to the supply voltage input of the VCO. The voltage supply adjusts the voltage level of its output in response to changes of the adjust input. The control circuit has a first adjust output coupled to the adjust input of the voltage supply to adjust the gain of the VCO. The VCO may include a frequency range adjust input controlled by the control circuit so that the gain of the VCO is adjusted when the frequency range is changed. For a multi-band VCO, the gain is adjusted for different frequency bands to maintain a relatively constant gain for each frequency band.

19 Claims, 8 Drawing Sheets

VOLTAGE CONTROLLED OSCILLATOR WITH GAIN CONTROL

BACKGROUND OF THE INVENTION

1. Field of the Invention

The present invention relates in general to electronic devices, and more specifically to a voltage controller oscillator circuit with low noise gain control.

2. Description of the Related Art

Many different frequency bands are known and in use today for mobile wireless applications, including the Universal Mobile Telecommunications System (UMTS) band operating in the 1.920–2.170 gigahertz (GHz) frequency range, the Personal Communications Services (PCS) band operating in the 1.850–1.990 GHz frequency range, the Digital Communications Services (DCS) band operating in the 1.710–1.880 GHz frequency range, the "900 band" operating in the 880–960 megahertz (MHz) frequency range, the "800 band" operating in the 824–894 MHz frequency range, etc., where each listed frequency band includes both transmit and receive frequencies. Mobile phone manufactures often need to design phones that are operable in multiple frequency bands for use by one or more different mobile phone service providers. Chip manufacturers desire to design and build chip sets that may be used for any phone and/or for any service provider anywhere in the world. Similar needs exist for other wireless and wireline applications.

The heart of a wireless chip is the phase locked loop (PLL), and an essential component of the PLL is the voltage controlled oscillator (VCO). The gain factor "KV" of a conventional multi-band VCO changes commensurate with frequency changes as the VCO is switched from one frequency band to another. It has been very difficult to keep the VCO gain within a specified range when band switching over a large frequency range. The problem of maintaining a relatively constant gain is compounded by the fact that a single discrete PLL filter is typically used for all bands on the same printed circuit board (PCB). PLL dynamics dictate that the VCO gain should be as constant as possible over the entire operable frequency range. The conventional VCO was designed for a fixed supply voltage. A current source has often been used for VCO bias and sometimes as a shut-off mechanism for the VCO. It has been determined, however, that a very large percentage (e.g., approximately 70%) of the noise in conventional VCOs is attributable to this current source.

It is desired to keep the gain factor KV as constant as possible over the entire operable frequency range of the VCO. It is desired to be able to perform KV calibration at any time during operation and over operating temperature ranges. It is desired to be able to control the KV variation to achieve improved PLL performance and to optimize current drain in the VCO. It is desired to provide a VCO for a wide range of applications, including modern wireless transceivers which tend to require wide frequency range coverage. And it is desired to enable the design of fully integrated, multi-band direct-conversion transmitters for existing and future wireless and wireline applications.

BRIEF DESCRIPTION OF THE DRAWINGS

The benefits, features, and advantages of the present invention will become better understood with regard to the following description, and accompanying drawing in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

Figure 1:
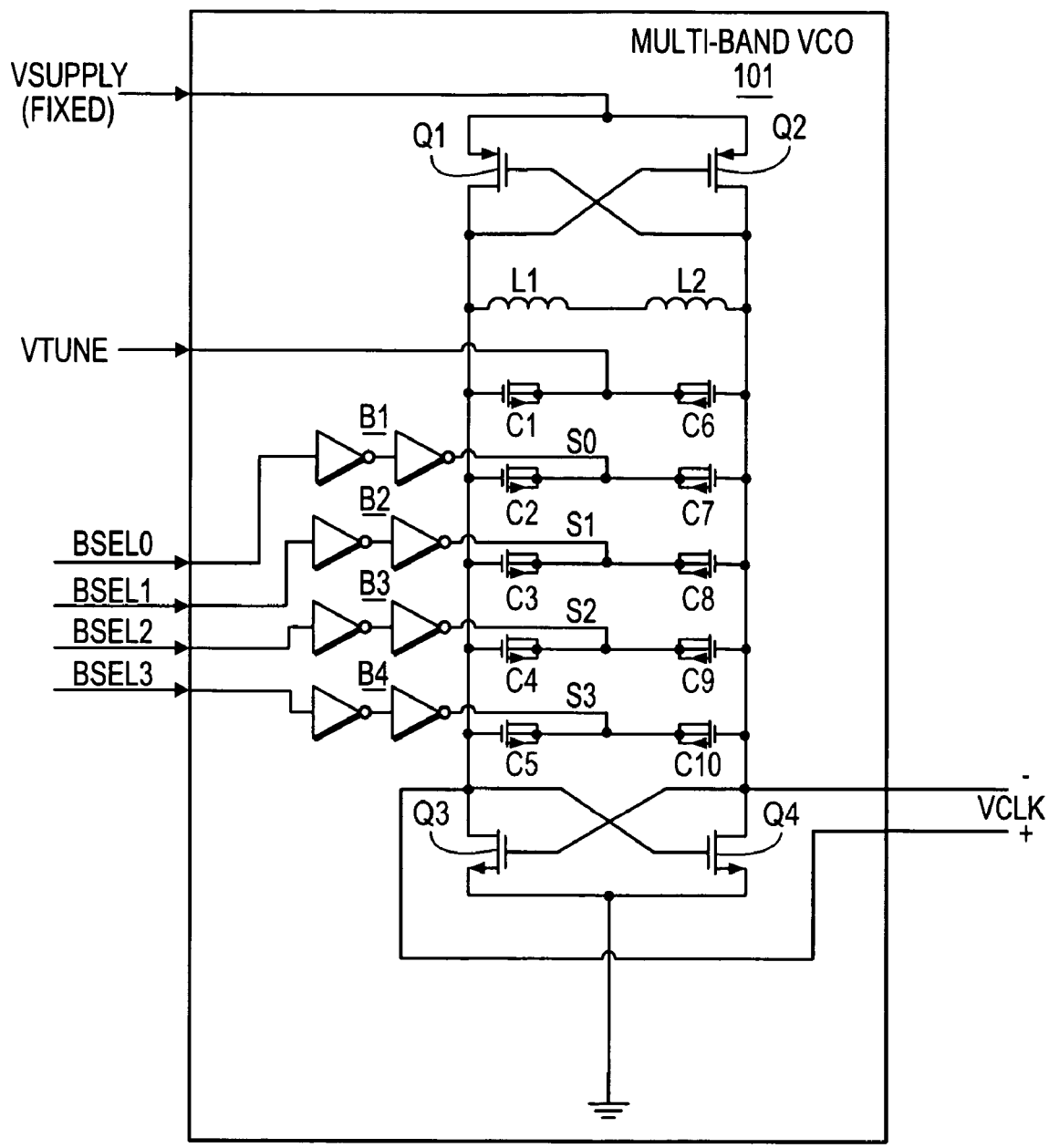
FIG. 1 is a schematic diagram of a conventional multi-band VCO according to prior art.

FIG. 1 is a schematic diagram of a conventional multi-band voltage controlled oscillator (VCO) 101 according to prior art. The VCO 101 receives power from a supply voltage VSUPPLY, which is fixed. In some configurations, VSUPPLY may be adjusted by a trim mechanism or the like, such as blown fuses or resistors or the like, but is fixed at the time of manufacture of the electronic device employing the VCO 101. The VCO 101 has a control input that receives a tune voltage signal VTUNE for controlling the frequency of a clock signal VCLK provided at an output, which is illustrated as a differential signal with positive (+) and negative (−) polarity signals. Four frequency band select signals BSEL0, BSEL1, BSEL2 and BSEL3 (the BSEL signals) are provided via respective frequency select inputs for selecting one of up to 16 different frequency bands. Although 4 band select signals are shown for illustration, it is appreciated that any number of frequency select inputs (e.g., one or more) may be included.

In the configuration shown, VSUPPLY is provided to the source electrodes of a cross-coupled pair of P-channel MOS transistors Q1 and Q2. The drain electrode of Q1 is coupled to the gate electrode of Q2, having its drain coupled to the gate electrode of Q1. The drain electrode of Q1 is further coupled to one end of an inductor L1, to one end each of capacitors C1, C2, C3, C4 and C5, to the drain electrode of an N-channel MOS transistor Q3 and to the gate electrode of another N-channel MOS transistor Q4. The drain electrode of Q2 is further coupled to one end of an inductor L2, to one end each of capacitors C6, C7, C8, C9 and C10, to the drain electrode of Q4 and to the gate electrode of Q3. The other ends of the inductors L1 and L2 are coupled together. The VTUNE signal is provided to the other ends of the capacitors C1 and C6, which are coupled together. The BSEL0 signal is provided to an input of a buffer B1, having an output developing a select signal S0 and which is coupled to the other ends of the capacitors C2 and C7. The BSEL1 signal is provided to an input of a buffer B2, having an output developing a select signal S1 which is coupled to the other ends of the capacitors C3 and C8. The BSEL2 signal is provided to an input of a buffer B3, having an output developing a select signal S2 which is coupled to the other ends of the capacitors C4 and C9. The BSEL3 signal is provided to an input of a buffer B4, having an output developing a select signal S3 which is coupled to the other ends of the capacitors C5 and C10. The sources of Q3 and Q4 are coupled together and to ground. The gates of Q4 and Q3 collectively form the differential output clock signal VCLK. The capacitors C1–C10 are MOS voltage variable capacitors which can be though of as NMOS transistors having their gate electrodes forming one terminal and its drain, source and substrate electrodes coupled together to form its other terminal. The buffers B1–B4 are each shown as a pair of serially-coupled inverters, but may be implemented in any manner.

The frequency band of the VCO 101 is selected by the BSEL0–BSEL3 signals, each selectively coupling a corresponding pair of capacitors to the inductors L1 and L2. The values of the capacitors of the capacitor pairs C1 & C6, C2 & C7, C3 & C8, C4 & C9, C5 & C10, may be weighted in any manner, such as a binary weighting or the like, to switch between frequency bands or frequency segments within the bands. Binary weighting is particular advantageous by enabling control logic to conveniently select from among multiple frequency segments of multiple frequency bands using digital values. The VTUNE signal adjusts the frequency within a selected frequency band or segment, which is typically controlled within a phase lock loop (PLL) configuration. The gain factor KV of the VCO 101, however, varies considerably from one band to the next as further described below. Another MOS transistor may be included having its drain and source coupled between the source electrodes of Q3 and Q4 and ground and having a gate receiving a bias voltage. The added transistor effectively operated as a current source in which the bias voltage was adjusted to bias the VCO 101. The added transistor was also used as a shut-off mechanism, such as by dropping the bias voltage to zero to shut down the VCO 101. However, it has been determined that up to 70% of the noise in the VCO 101 can be attributed to the optional current source device.

Figure 2:
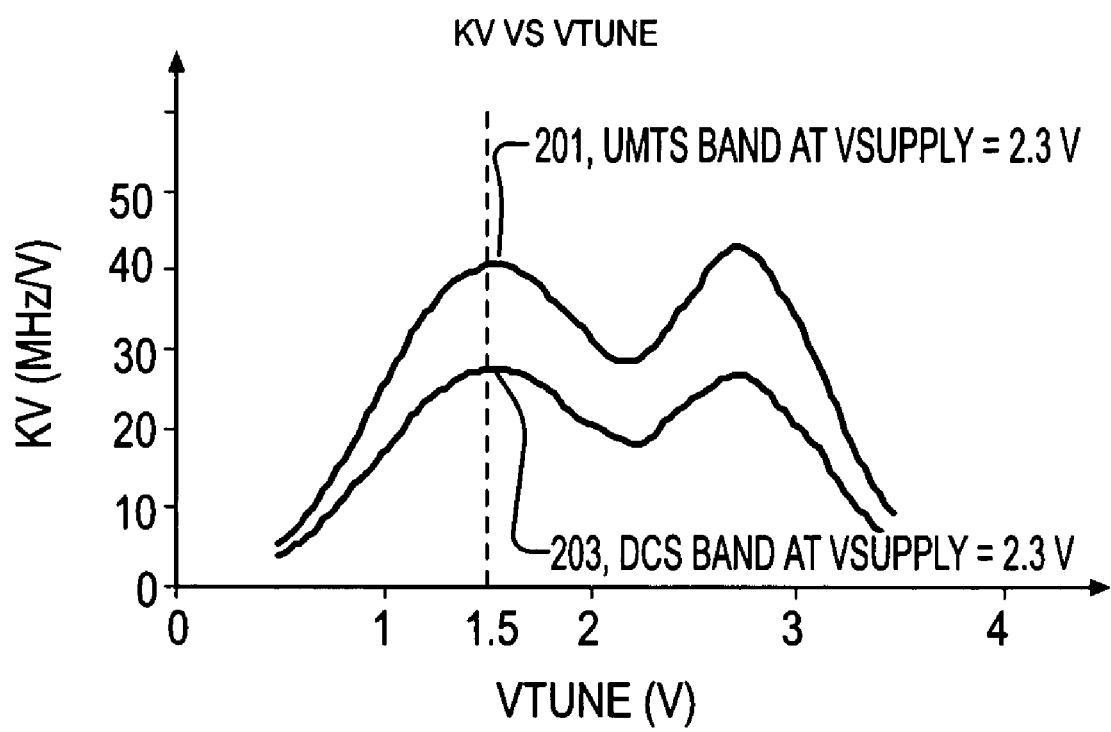
FIG. 2 is a graph diagram illustrating the variation in gain factor versus tune voltage between a first frequency band and a second frequency band at a selected voltage level of supply voltage for the VCO of FIG. 1.

FIG. 2 is a graph diagram illustrating the variation in gain factor KV versus VTUNE between a first frequency band and a second frequency band at a selected voltage level of VSUPPLY for the VCO 101. In this case, VSUPPLY is approximately 2.3 Volts (V), the first band is UMTS and the second band is DCS, although the same principle may be demonstrated with any selected VSUPPLY and between any two different frequency bands. A first curve 201 illustrates the gain factor KV of the UMTS band for VSUPPLY=2.3V and a second curve 203 illustrates the gain factor KV of the DCS band at the same VSUPPLY voltage level of 2.3V. As illustrated, the gain factor for the UMTS band at VTUNE=1.5V is about 41 MHz/V whereas the gain factor for the DCS band at VTUNE=1.5V is about 27.5 MHz/V. The variation of the gain factor KV is even more pronounced when VTUNE is between 2.5–3V. It is noted that adjusting the fixed value of VSUPPLY simply shifts both curves 201 and 203 in the same direction and does not resolve the gain factor differential between the bands.

Figure 3:
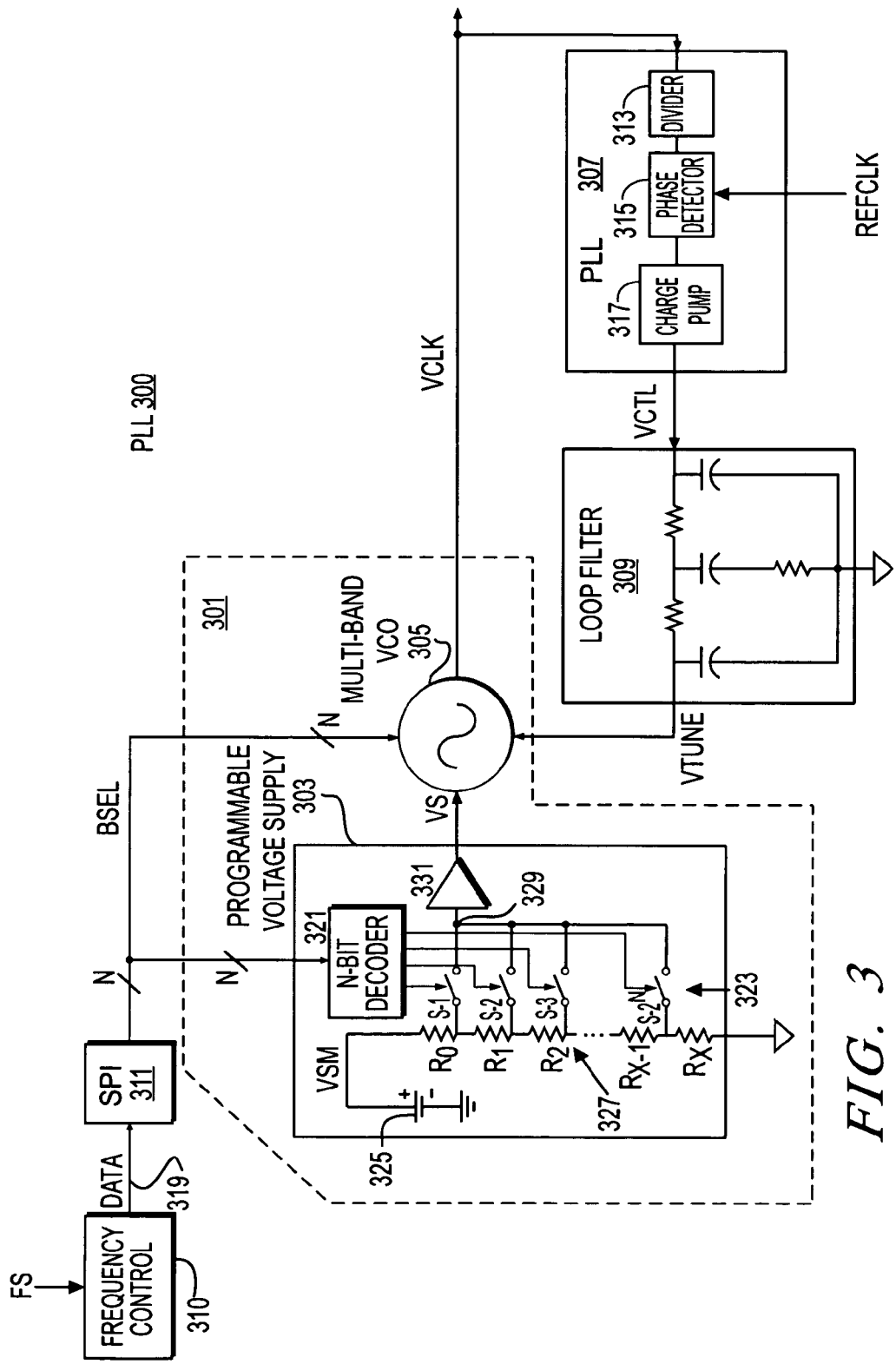
FIG. 3 is a block diagram of a PLL circuit with an exemplary VCO circuit implemented according to an embodiment of the present invention.

FIG. 3 is a block diagram of a PLL circuit 300 with an exemplary VCO circuit 301 implemented according to an embodiment of the present invention. In this embodiment, the VCO circuit 301 includes a programmable voltage supply 303 and a multi-band VCO 305. The VCO 305 may be implemented in a similar manner as the VCO 101 of FIG. 1, where a suitable number (e.g., N) of weighted capacitive branches are provided for switching between frequency bands or frequency segments within the frequency bands. The VCO 305 has an output providing a voltage-controlled clock signal VCLK, which is fed back to the input of a PLL control circuit 307. The PLL control circuit 307 has an output providing a voltage control signal VCTL, which is provided to the input of a loop filter 309. The loop filter 309 has an output providing a voltage tune signal VTUNE, which is provided to the voltage control input of the VCO 305. In the illustrated embodiment, the PLL control circuit 307 includes a divider circuit 313, which has an input receiving the VCLK signal and an output coupled to one input of a phase detector 315. The divider circuit 313 divides the frequency of the VCLK signal by a predetermined divide factor, which is not further described. The phase detector 315 has another input receiving a reference clock signal REFCLK and compares the frequency and/or phase of the divided VCLK signal and the REFCLK signal (e.g., a phase-frequency detector) and has an output coupled to an input of a charge pump 317. The charge pump 317 has an output providing the VCTL signal. Further details of the PLL control circuit 307 are not further described. The loop filter 309 is shown as a resistor-capacitor (RC) filter circuit as shown and as known to those skilled in the art and is not further described.

A serial to parallel interface (SPI) 311 receives serial DATA for programming the PLL 300 via a serial input line 319 from a frequency control circuit 310. The SPI 311 has parallel outputs providing the N BSEL digital signals, which are provided to respective parallel inputs of the programmable voltage supply 303 and the multi-band VCO 305. The frequency control circuit 310 may be integrated onto the same chip or integrated circuit (IC) that holds the PLL circuit 300, or is implemented on a separate IC or as discrete logic. The frequency control circuit 310 receives a frequency set signal FS and "sets" the DATA to program an indicated frequency band and then outputs the data to the SPI 311. A serial interface is advantageous in that the DATA can be delivered to the program the PLL circuit 300 on a single data line 319. The number N is an integer greater than or equal to 1 and the BSEL signals enable switching between multiple frequency bands of operation. For N=2, up to four different frequency bands may be programmed, if N=5, up to 32 different frequency bands may be programmed, etc. Within the voltage supply 303, the BSEL signals are provided to an N-bit decoder 321, which outputs $2^N$ decoded signals, each provided to a control input of a respective one of a series of $2^N$ switches 323, individually labeled S-1, S-2, S-3, . . . , S-$2^N$. The switches 323 may be implemented with MOS switches or the like as known to those skilled in the art, and are each represented as a normally-open single-pole, single-throw (SPST) switch. A voltage source 325 has its negative terminal coupled to ground and its positive terminal providing a voltage VSM to one end of a first resistor $R_0$ of a resistor string 327. The resistor string 327 includes multiple resistors $R_0$, $R_1$, $R_2$, . . . , $R_X$ coupled in series between the voltage supply 325 and ground and includes at least $2^N$ nodes, each coupled to one switched terminal of a corresponding one of the switches 323. In this manner, the voltage VSM of the voltage supply 325 is subdivided into at least $2^N$ discrete voltage levels between VSM and ground on respective voltage nodes. The other switched terminal of each of the switches 323 is coupled to a common node 329, which is coupled to the input of a buffer/driver 331. The output of the buffer/driver 331 provides a voltage supply signal VS, which is provided to a voltage supply input of the VCO 305.

The number X is also an integer and is a suitable number to ensure a sufficient number of resistors and corresponding intermediate nodes of the resistor string 327 to provide the desired voltage levels for each of the different frequency bands of operation. In the illustrated embodiment of the PLL circuit 300, X is shown as equal to $2^N$. Although there are up to $2^N$ possible frequency bands for the PLL circuit 300, there may be less than $2^N$ frequency bands that are used so that X need only be sufficiently large that the proper voltage levels are provided (e.g., X may be less than $2^N$). The voltage level of VS may be the same for two or more frequency bands depending upon their relative frequency ranges. The supply voltage may also be divided into any number of voltages with desired resolution. For example, X may be substantially greater than $2^N$ or greater than the number of operable frequency bands so that the resolution of the number of voltage levels is increased to improve accuracy. The number of resistors of the resistor string 323 is selected to provide the desired resolution of each voltage level of the VS signal provided to the VCO 305 for each of the frequency bands of operation.

The programmable voltage supply 303 is shown in simplified form to more clearly illustrate the principles of the present invention. The voltage supply 303 may be implemented as a "super filter" circuit for supplying accurate and clean power to the VCO 305. For example, an exemplary super filter circuit includes a bandgap circuit for generating a reference voltage. A bypass capacitor is used to filter the reference voltage, which is provided to the input of an error amplifier. The error amplifier senses the noise on the supply line and drives a pass transistor to cancel the sensed noise.

In operation, the BSEL data is provided serially from the frequency control circuit 310 to the SPI 311 via the serial line 319 to program the frequency band of operation, which information is converted to parallel format by the SPI 311 and provided as the N BSEL signals. The decoder 321 decodes the N BSEL signals and activates (or otherwise closes) a corresponding one of the switches 323 to provide a selected voltage level on the node 329. The selected voltage level is buffered by the buffer/driver 331, which drives the VS signal to a corresponding voltage level for the VCO 305. The buffer/driver 331 may be configured as a unity gain amplifier in which the voltage level of VS is the same as the voltage level selected by the decoder 321. Alternatively, the buffer/driver 331 amplifies the selected voltage level by any suitable gain factor which is less than, equal to or greater than one. The N BSEL signals also program the operable frequency band of the VCO 305 as previously described. In this manner, the voltage level of VS is adjusted commensurate with the frequency band of the VCO 305 to both select the frequency band and to adjust the gain KV for the selected band.

Figure 4:
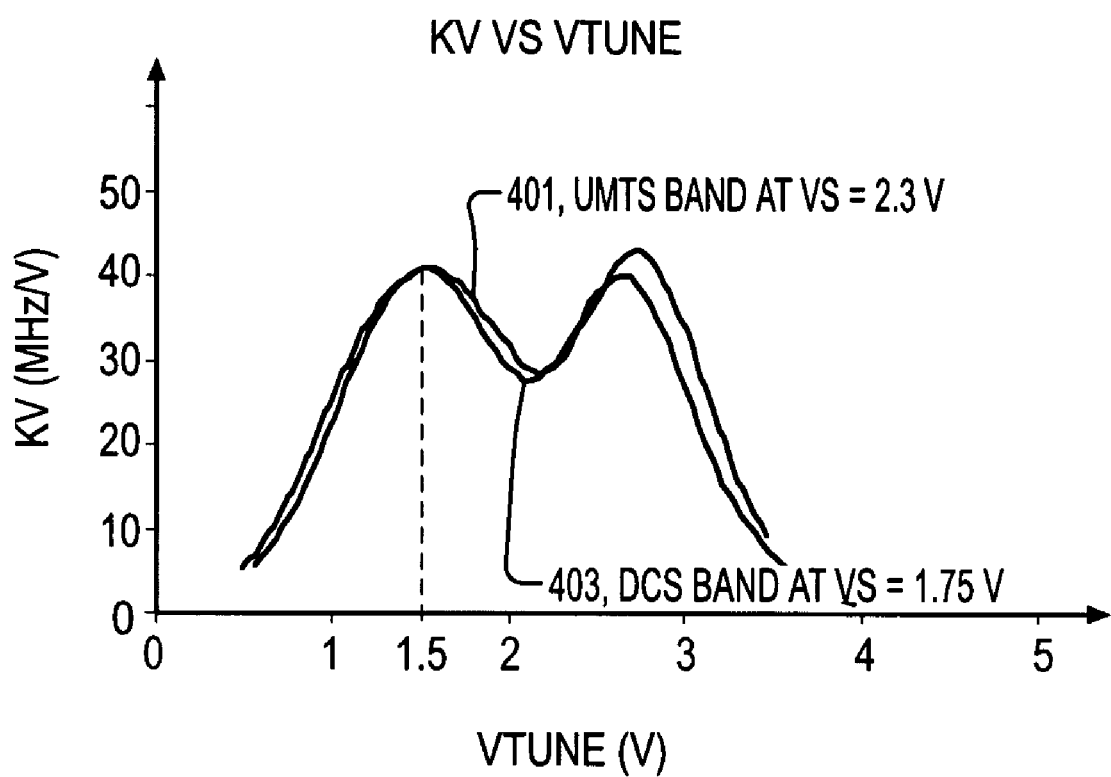
FIG. 4 is a graph diagram illustrating the variation in the gain factor versus tune voltage between a first frequency band and a second frequency band at selected and different supply voltage levels for the VCO circuit of FIG. 3.

FIG. 4 is a graph diagram illustrating the variation in the gain factor KV versus VTUNE between a first frequency band and a second frequency band at selected and different voltage levels of VS for the VCO circuit 301. In this case, VS is approximately 2.3V for the UMTS band and is approximately 1.75V for the DCS band. A first curve 401 illustrates the gain factor KV of the UMTS band for VS=2.3V and a second curve 403 illustrates the gain factor KV of the DCS band for VS=1.75V. As illustrated, the gain factor KV for both the UMTS band and the DCS band at VTUNE=1.5V is about the same, or about 41 MHz/V. The gain variation diverges somewhat for VTUNE between 2.5–3V, but significantly less so that that of the curves 201 and 203 of FIG. 2. In this manner, reducing the supply voltage VS for the VCO 305 for a lower frequency band increased the gain factor by a corresponding amount so that the gain factor differential between the two frequency band settings was minimized.

Figure 5:
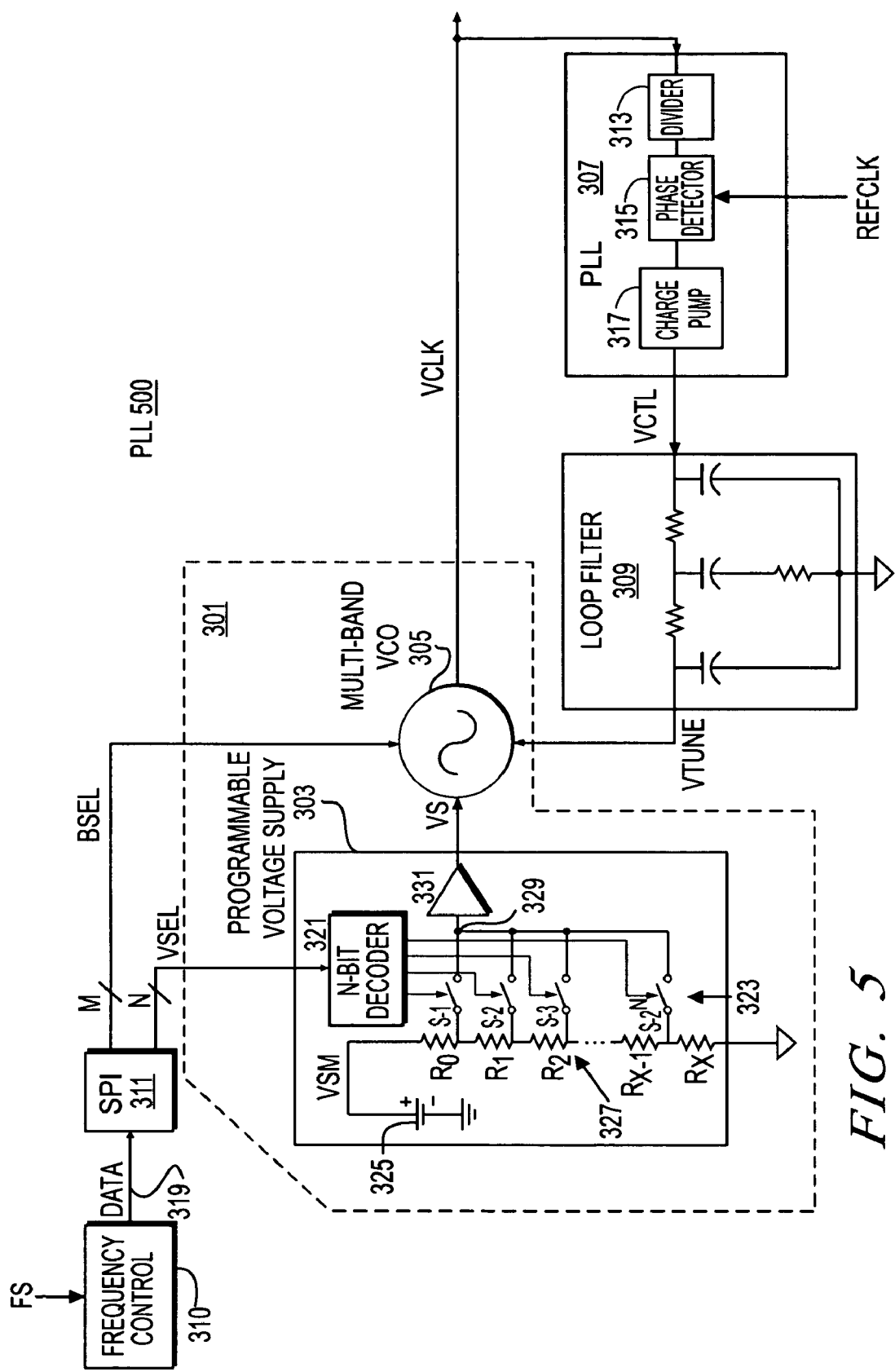
FIG. 5 is a block diagram of a PLL circuit according to another embodiment of the present invention and including the VCO circuit of FIG. 3.

FIG. 5 is a block diagram of another PLL circuit 500 including the VCO circuit 301. The PLL circuit 500 is substantially similar to the PLL circuit 300 in which similar components assume identical reference numbers. The configuration and operation of the PLL circuit 500 is substantially the same as PLL circuit 300 except that the select bits provided by the SPI 311 are divided into a first group of M frequency band select bits BSEL and a second group of N voltage select bits VSEL. The M BSEL bits are provided to the VCO 305 and the N VSEL bits are provided to the decoder 321 of the voltage supply 303. In this case, at least 2 bits of DATA are shifted into the SPI 311, which asserts at least one BSEL bit (e.g., M is 1 or more) and at least one VSEL bit (e.g., N is 1 or more). In this manner, the VCO 305 and the voltage supply 303 are separately and independently programmable with a separate set of frequency and voltage select control bits, which provides a greater degree of flexibility and control.

Figure 6:
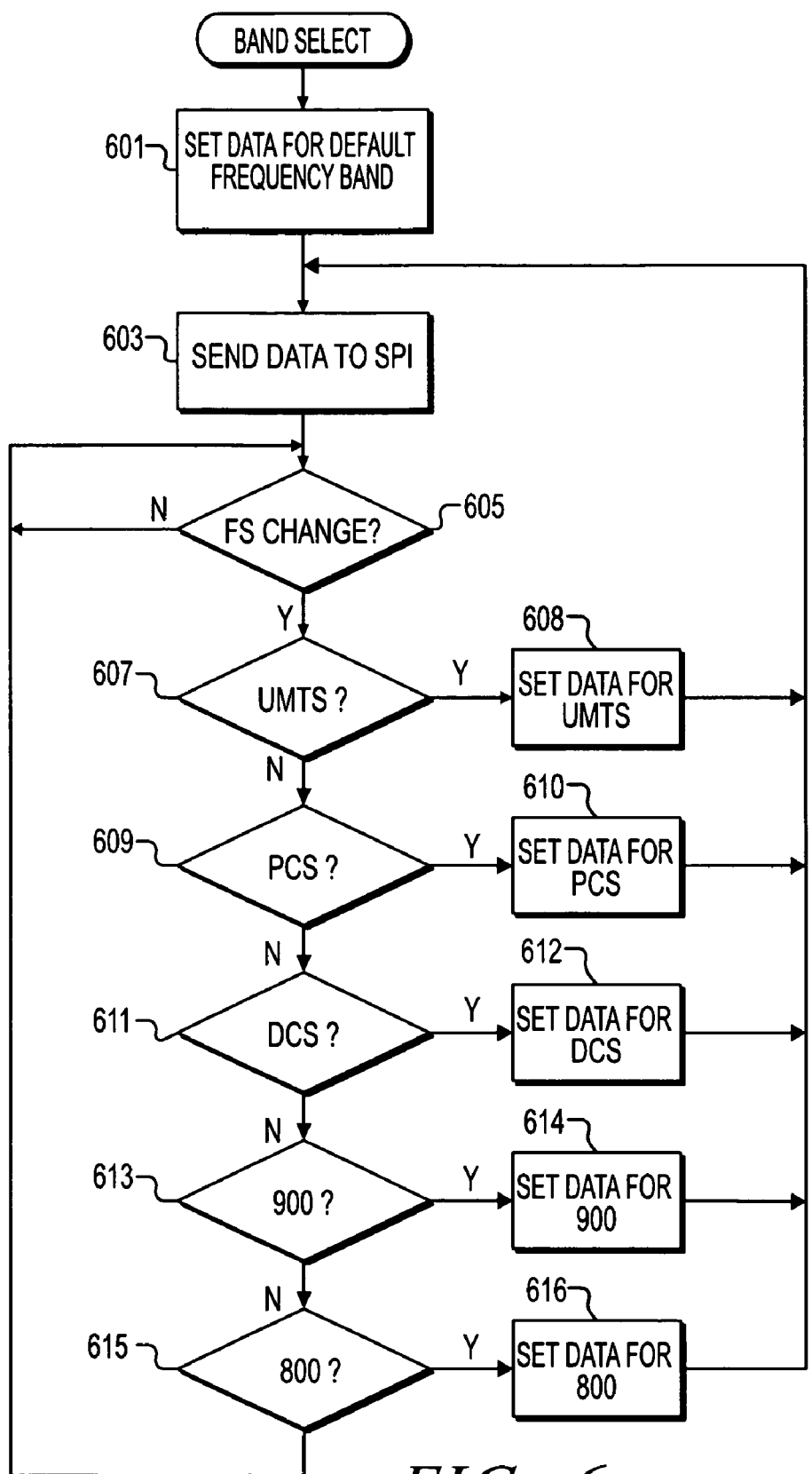
FIG. 6 is a flow chart diagram illustrating exemplary operation of the frequency control circuit of FIG. 3 according to an embodiment of the present invention.

FIG. 6 is a flow chart diagram illustrating exemplary operation of the frequency control circuit 310 according to an embodiment of the present invention. The flow chart illustrates selecting from among five separate frequency bands, including the UMTS band, the PCS band, the DCS band, the 900 band and the 800 band, although any combination of the frequency bands is contemplated, and any other frequency band is contemplated for various configurations, including those currently known and those developed in the future. At a first block 601, the DATA is set for an optional default frequency band, which is a selected one of the available operable frequency bands for a given configuration (e.g., UMTS). The particular DATA bits for each band depends upon the configuration of the VCO circuit 301 and whether the same or different bits are used to program the voltage supply 303 and the VCO 305. At next block 603, the DATA is sent to the SPI 311 for programming the PLL for the selected frequency band. In the first iteration, the default frequency band is programmed and in subsequent iterations, a selected frequency band is programmed. And in each case in which the frequency band is changed, the supply voltage is updated, if necessary, to select a new gain factor KV for the selected frequency band. At next block 605, it is queried whether the FS signal is changed or otherwise asserted. If not, operation loops back to block 605 and stays in a continuous loop until the FS signal indicates a new frequency band.

If and when the FS signal indicates a new frequency band as determined at block 605, operation proceeds to block 607 to determine whether the UMTS band is selected. If so, operation proceeds to block 608 to set the DATA for the UMTS band. Otherwise, operation proceeds to block 609 to determine whether the PCS band is selected. If so, operation proceeds to block 610 to set the DATA for the PCS band. Otherwise, operation proceeds to block 611 to determine whether the DCS band is selected. If so, operation proceeds to block 612 to set the DATA for the DCS band. Otherwise, operation proceeds to block 613 to determine whether the 900 band is selected. If so, operation proceeds to block 614 to set the DATA for the 900 band. Otherwise, operation proceeds to block 615 to determine whether the 800 band is selected. If so, operation proceeds to block 616 to set the DATA for the 800 band. Otherwise, if no other bands are available, operation proceeds back to block 605 (or otherwise to an error algorithm). From any of blocks 608, 610, 612, 614 and 616, operation loops back to block 603 to send the programmed DATA to the SPI 311 to program the PLL for the new frequency band and corresponding gain factor, and then operation proceeds back to block 605 to monitor the FS signal.

Figure 7:
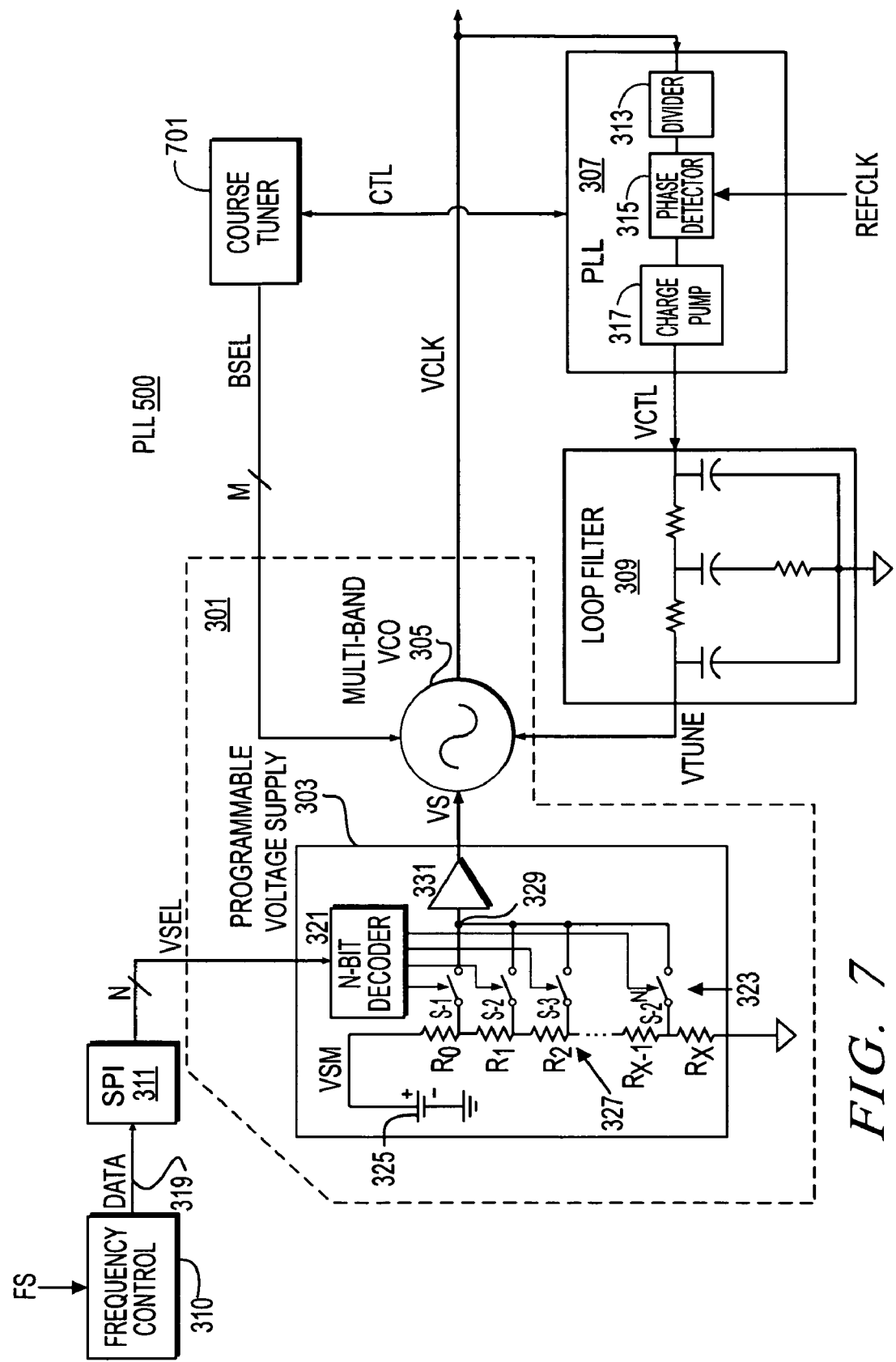
FIG. 7 is a block diagram of another PLL circuit according to and embodiment of the present invention including the VCO circuit of FIG. 3 and illustrating course tuning.

FIG. 7 is a block diagram of another PLL circuit 700 according to another embodiment of the present invention including the VCO circuit of FIG. 3 and illustrating course tuning. The PLL circuit 700 is substantially similar to the PLL circuit 500 in which similar components assume identical reference numbers. In this embodiment, however, the PLL 307 is coupled to a course tuner circuit 701 via control signals CTL and the course tuner circuit 701 provides the M BSEL signals to the VCO 305. During initialization or when switching between frequency bands, the course tuner 701 temporarily disables the charge pump 317 thereby opening the control loop controlling VTUNE for adjusting VCLK. The course tuner circuit 701 monitors REFCLK and VCLK and asserts the BSEL signals to adjust the frequency of VCLK as close as possible to that of REFCLK. After course tuning is complete, the course tuner circuit 701 re-enables the charge pump 317 to close the loop to enable fine tuning via the VTUNE signal. Binary weighting within the VCO 305 is advantageous for the PLL circuit 700 so that the course tuner circuit 701 outputs the BSEL signals as a digital value for selecting from among multiple frequency segments. The frequency control circuit 310 outputs the DATA value to select a voltage level for VS appropriate for the selected frequency band and/or segment. The course tuner circuit 701 may be incorporated within the frequency control circuit 310, although it is understood that the frequency control function need not be centralized but may be distributed in the circuitry as illustrated by the PLL 700.

In an actual experimental configuration using a real VCO, it was determined that the UMTS band gain for VS=2.3V had a gain factor KV of 240 MHz/V, the PCS band for VS=2.0V had a gain factor KV of 219 MHz/V, and the 800 band for VS=1.75V had a gain factor KV of 220 MHz/V. For the 800 band, the gain factor was only 150 MHz/V when VS was kept at the same voltage level (2.3V) as that for the UMTS band. In this manner, when the supply voltage to the VCO was kept constant, the gain factor KV dropped significantly with a decrease in frequency, whereas the gain factor was kept relatively constant when the VCO supply voltage was also reduced by a commensurate amount. The particular voltage level for any given frequency band can be determined experimentally to achieve a target gain factor or to stay within a target gain factor range when switching from one frequency band to another.

Those of skill in the art will recognize that, based upon the teachings herein, several modifications may be made to the embodiments shown and described herein. For example, the multi-band VCO is shown with a digital program interface for receiving the BSEL signals, although an analog interface is contemplated. Likewise, the programmable voltage supply is shown with a digital interface for receiving the BSEL or VSEL signals, although an analog version of the programmable voltage supply is contemplated. The decoder at the input of the voltage supply is any appropriate converter that converts the voltage control signal to the select signals used to control the voltage provided at its output. The frequency control functions are illustrated in a separate and centralized control block, where it is understood that the control functions may be distributed instead. Also, the frequency programming information is transferred serially and converted to parallel format, where digital signals may be provided as parallel signals or converted from serial to parallel at each programmable device. The VCO circuit is shown as part of a PLL circuit, although a VCO circuit with gain control according to the present invention may be used in other circuits and for any other application. The illustrated wireless frequency bands are exemplary only and other frequency bands or ranges are contemplated for either wireless or wireline applications.

Figure 8:
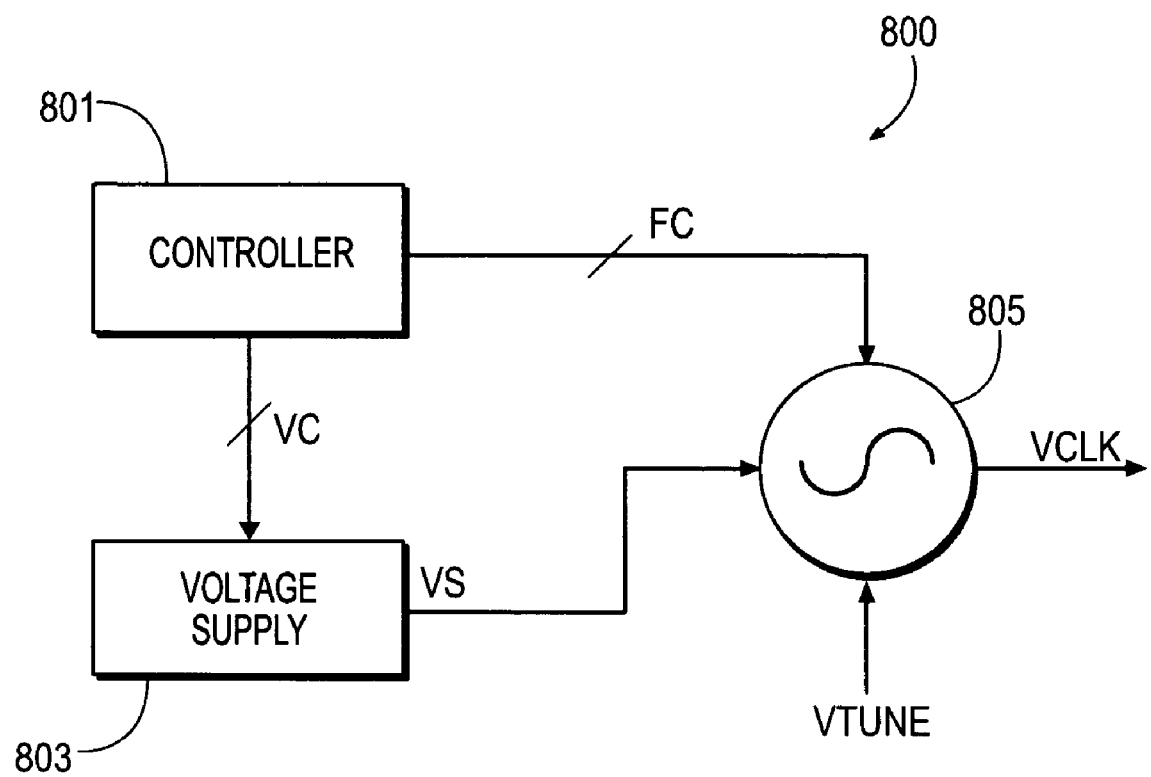
FIG. 8 is a simplified block diagram of a VCO circuit according to another embodiment of the present invention.

FIG. 8 is a simplified block diagram of a VCO circuit 800 according to another embodiment of the present invention. A controller 801 has a first output providing a voltage control signal VC to a variable voltage supply 803, which has an output providing the supply voltage VS to the supply voltage input of a VCO 805. The VCO 805 includes a frequency tune input receiving the VTUNE voltage and has an output providing the VCLK signal. The controller 801 optionally includes a second output providing a frequency control signal FC to a frequency range adjust input of the VCO 805. The VC signal has any one of variable forms, such as one or more analog or digital signals depending upon the configuration. The controller 801 controls the gain of the VCO 805 by adjusting or controlling the VC signal provided to the voltage supply 803. The VS signal may have discrete voltage levels or may be a controlled analog signal for controlling the supply voltage to the VCO 805. The FC signal, if provided, has any one of similar forms like the VC signal. In one embodiment, the VCO 805 is a single-band VCO or otherwise operates within a relatively narrow frequency range. In this first embodiment, the FC signal is not provided and the controller 801 adjusts the gain of the VCO 805 by adjusting the VC signal. In a second embodiment, the FC signal is provided and the VCO 805 operates in a wider frequency range, such as a wideband VCO or the like. In this second embodiment, the controller 801 adjusts the frequency range of operation via the FC signal and adjusts the gain of the VCO 805 via the VC signal. As described previously, the VC and FC signals may be different signal for independent frequency/gain control or they may be the same signal, in which case the frequency range and corresponding gain are adjusted with the same signal. In a third embodiment, the VC and FC signals are digital signals and the VCO 805 is a multi-band VCO for selecting between multiple frequency bands or segments and corresponding gain factors. Again, the VC and FC signals may be different digital signals for independent frequency/gain control or they may be the same digital value provided to both.

A VCO circuit according to an embodiment of the present invention includes a VCO, a voltage supply and a control circuit. The VCO has a supply voltage input and a gain that changes with the voltage level of the supply voltage input. The voltage supply has an adjust input and a supply voltage output coupled to the supply voltage input of the VCO, where the voltage supply adjusts voltage level of the supply voltage output in response to changes of the adjust input. The control circuit has a first adjust output coupled to the adjust input of the voltage supply and controls the first adjust output to adjust the gain factor of the VCO.

The voltage supply may be a super filter including a voltage source, a resistor string, select logic, a driver and a decoder. The resistor string is coupled to the voltage source and has selectable voltage nodes. The select logic has inputs coupled to the voltage nodes and an output. The driver has an input coupled to the output of the select logic and an output coupled to the supply voltage input of the VCO. The decoder has an input coupled to the first adjust output of the control circuit and multiple outputs coupled to the select logic for selecting one of the voltage nodes. The adjust input of the voltage supply may be implemented as a digital interface. The select logic may be multiple switches or the like, each having a control input receiving a corresponding decoded signal, a first switched terminal coupled to a corresponding voltage node, and a second switched terminal coupled to the input of the driver.

The first adjust output of the control circuit may be coupled to a frequency range adjust input of the multi-band VCO. The control circuit controls the first adjust output to select a frequency range and a corresponding gain of the VCO. The VCO may be implemented as a multi-band VCO where the control circuit switches between multiple frequency bands. In a digital configuration, the control circuit changes the first adjust output to select from among discrete frequency bands and corresponding gain factors.

The control circuit may include a first adjust output coupled to the voltage supply and a second adjust output coupled to the frequency range adjust input of the VCO. In this case, the control circuit controls the first adjust output to select a gain and controls the second adjust output to select a frequency range. The first and second adjust outputs may be digital and may be independently controlled. The VCO circuit may be used is a PLL circuit or in any other application employing a VCO including a multi-band VCO.

A method of controlling gain of a VCO, which has a supply voltage input and a gain which varies with voltage level of the supply voltage input, includes operating the VCO within a first frequency range, providing a first voltage level to the supply voltage input of the VCO to achieve a first gain level, and providing, while the VCO is operating, a second voltage level to the supply voltage input of the VCO to achieve a second gain level.

The providing a first voltage level and a second voltage level may each include providing a select value to a programmable voltage supply which provides a corresponding supply voltage to the supply voltage input of the VCO. The method may further include changing to a second frequency range and operating the VCO in the second frequency range, and adjusting the level of supply voltage to the second voltage level to achieve the second gain level for the second frequency range.

The VCO may includes a frequency band select input, in which case the method may include providing the frequency band select input to operate the VCO at a first frequency band, changing the frequency band select input to operate the VCO at a second frequency band, and adjusting the level of supply voltage to the second voltage level to achieve the second gain level for the second frequency band.

The providing the frequency band select input and adjusting the level of supply voltage may each include providing a select value to the frequency band select input of the VCO and providing the select value to a programmable voltage supply which provides a corresponding supply voltage to the supply voltage input of the VCO. Alternatively, the method includes providing a first select value to the frequency band select input of the VCO and providing a second select value to a programmable voltage supply which provides a corresponding supply voltage to the supply voltage input of the VCO.

A VCO circuit according to the present invention maintains a relatively constant gain factor over the entire operable frequency range of the VCO. Gain calibration may be performed at any time during operation and over operating various temperature ranges. The gain variation is controlled to achieve improved PLL performance and to optimize current drain in the VCO. The VCO circuit is suitable for a wide range of applications, including modern wireless transceivers which tend to require wide frequency range coverage. The VCO circuit enables the design of fully integrated, multi-band direct-conversion transmitters for existing and future wireless and wireline applications.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A voltage controlled oscillator (VCO) circuit, comprising:
   a VCO having a supply voltage input and a frequency range adjust input, wherein said VCO has a gain that changes with voltage level of said supply voltage input;
   a voltage supply having an adjust input and a supply voltage output coupled to said supply voltage input of said VCO, wherein said voltage supply adjusts voltage level of said supply voltage output in response to changes of said adjust input; and
   a control circuit having a at least one adjust output coupled to said adjust input of said voltage supply and to said frequency range adjust input of said VCO, wherein said control circuit controls said at least one adjust output to adjust frequency range and said gain of said VCO during operation of the VCO circuit.

2. The VCO circuit of claim 1, wherein:
   said at least one adjust output of said control circuit comprises a single adjust output which is coupled to said frequency range adjust input of said VCO and to said adjust input of said voltage supply; and
   wherein said control circuit controls said single adjust output to adjust frequency range and gain of said VCO.

3. The VCO circuit of claim 2, wherein said VCO comprises a multi-band VCO wherein said control circuit switches between multiple frequency bands of said VCO.

4. The VCO circuit of claim 2, wherein said single adjust output of said control circuit, said adjust input of said voltage supply and said frequency range adjust input of said VCO each comprise a digital interface, and wherein said control circuit changes said single adjust output to select from among a plurality of discrete frequency bands and a corresponding plurality of gain factors of said VCO.

5. The VCO circuit of claim 1, wherein said voltage supply comprises a super filter, which further comprises:
   a voltage source;
   a resistor string coupled to said voltage source and having a plurality of selectable voltage nodes;
   select logic having a plurality of inputs coupled to said plurality of selectable voltage nodes and an output;
   a driver having an input coupled to said output of said select logic and an output coupled to said supply voltage input of said VCO; and
   a decoder having an input coupled to said at least one adjust output of said control circuit and a plurality of outputs coupled to said select logic for selecting one of said plurality of selectable voltage nodes.

6. The VCO circuit of claim 1, wherein:
   said control circuit has a first adjust output coupled to said adjust input of said voltage supply and a second adjust output coupled to said frequency range adjust input of said VCO; and
   wherein said control circuit controls said first adjust output to adjust gain and controls said second adjust output to adjust frequency range of said VCO.

7. The VCO circuit of claim 6, wherein said first and second adjust outputs of said control circuit, said adjust input of said voltage supply and said frequency range adjust input of said VCO each comprise a digital interface, and wherein said control circuit changes said first and second adjust outputs to select from among a plurality of discrete frequency bands and a corresponding plurality of gain factors of said VCO.

8. A phase lock loop (PLL) circuit, comprising:
   a VCO having a supply voltage input, a frequency band adjust input, a frequency tune input and an output providing a clock, wherein said VCO has a gain that changes with voltage level of said supply voltage input;
   a PLL control circuit having a first input receiving said clock, a second input receiving a reference clock, and an output providing a tune voltage to said frequency tune input of said VCO;
   a voltage supply, having a voltage control input and having a supply voltage output coupled to said supply voltage input of said VCO, that adjusts voltage level of said supply voltage output based on said voltage control input; and
   a controller having at least one adjust output coupled to said voltage control input of said voltage supply and to said frequency band adjust input of said VCO, wherein said controller controls said at least one adjust output to control gain and frequency band of said VCO during operation of the PLL circuit.

9. The PLL circuit of claim 8, wherein said voltage supply comprises a super filter, which further comprises:
   a plurality of voltage nodes;
   select logic having a plurality of inputs coupled to said plurality of voltage nodes and an output;
   a driver having an input coupled to said output of said select logic and an output coupled to said supply voltage input of said VCO; and
   a decoder having an input coupled to said at least one adjust output of said controller and a plurality of outputs coupled to said select logic for selecting one of said plurality of voltage nodes.

10. The PLL circuit of claim 8, wherein:
    said at least one adjust output of said controller comprises a single adjust output which is coupled to said frequency band adjust input of said VCO; and
    wherein said controller controls said single adjust output to adjust frequency band and gain of said VCO.

11. The PLL circuit of claim 10, wherein said single adjust output of said controller, said voltage control input of said voltage supply and said frequency band adjust input of said VCO each comprise a digital interface, and wherein said controller updates said single adjust output to switch between a plurality of discrete frequency bands and a corresponding plurality of gain factors.

12. The PLL circuit of claim 8, wherein said at least one adjust output of said controller comprises a first adjust output coupled to said voltage control input of said voltage supply for adjusting said gain and a second adjust output coupled to said frequency band adjust input of said VCO for controlling frequency band of operation.

13. The PLL circuit of claim 12, wherein said first and second adjust outputs of said controller, said voltage control input of said voltage supply and said frequency band adjust input of said VCO each comprise a digital interface, wherein said controller updates said first adjust output to select from among a plurality of gain factors of said VCO, and wherein said controller updates said second adjust output to select from among a plurality of discrete frequency bands of said VCO.

14. The PLL circuit of claim 13, wherein said plurality of discrete frequency bands comprises the Universal Mobile Telecommunications System band and the Personal Communications Services (PCS) band.

15. A method of controlling a voltage controlled oscillator (VCO), having a supply voltage input and a gain which varies with voltage level of the supply voltage input, said method comprising:
    operating the VCO within a first frequency range;
    providing a first voltage level to the supply voltage input of the VCO to achieve a first gain level;
    changing to a second frequency range and operating the VCO in the second frequency range; and
    adjusting the supply voltage input of the VCO from the first voltage level to a second voltage level to achieve a second gain level for the second frequency range.

16. The method of claim 15, wherein said providing a first voltage level and said adjusting the supply voltage input each comprises providing a select value to a programmable voltage supply which provides a corresponding supply voltage to the supply voltage input of the VCO.

17. The method of claim 15, wherein the VCO includes a frequency band select input, further comprising:
    said operating the VCO within a first frequency range comprising providing the frequency band select input to operate the VCO at a first frequency band; and
    said changing to a second frequency range comprising changing the frequency band select input to operate the VCO at a second frequency band.

18. The method of claim 17, wherein said providing the frequency band select input and said providing a first voltage level comprises providing a select value to the frequency band select input of the VCO and to a programmable voltage supply which provides a corresponding supply voltage to the supply voltage input of the VCO.

19. The method of claim 17, wherein said providing the frequency band select input and said changing the frequency band select input comprise providing first select values to the frequency band select input of the VCO and wherein said providing a first voltage level and said adjusting the supply voltage input comprise providing second select values to a programmable voltage supply which provides corresponding supply voltages to the supply voltage input of the VCO.

* * * * *